July 25, 1972 W. SCHEMBS 3,679,495

METHOD OF PRODUCING ELECTRONIC PLANAR-TYPE DEVICES APPLICABLE FOR HIGH FREQUENCY GERMANIUM PLANAR TRANSISTORS

Filed May 7, 1969

United States Patent Office 3,679,495
Patented July 25, 1972

3,679,495

METHOD OF PRODUCING ELECTRONIC PLANAR-TYPE DEVICES APPLICABLE FOR HIGH FREQUENCY GERMANIUM PLANAR TRANSISTORS

Wolfgang Schembs, Munich, Germany, assignor to Siemens Aktiengesellschaft, Berlin and Munich, Germany Filed May 7, 1969, Ser. No. 824,026
Claims priority, application Germany, May 7, 1968, P 17 64 269.2
Int. Cl. H01l 7/46
U.S. Cl. 148—179 12 Claims

ABSTRACT OF THE DISCLOSURE

Described is a method of producing a plurality of microsemiconductor components according to the planar method, more particularly, high frequency germanium planar transistors or integrated circuits, containing germanium planar transistors. The conventional method steps are employed up to the production of the emitter region. The process is characterized in that the emitter region is produced in the semiconductor body in a manner whereby a window, corresponding to the area of the emitter region, is etched into the masking layer which is produced on the semiconductor crystal surface after the base diffusion. The emitter material is subsequently applied over the entire area, in form of a metal layer, upon the crystal surface, freed from the masking layer, and on the adjacent masking layer, covered by the photo varnish layer. The photo varnish layer and thus the metal layer located thereon are removed by a suitable solvent. Finally, the emitter material located directly on the crystal surface is alloyed into the semiconductor body.

Figure 1:
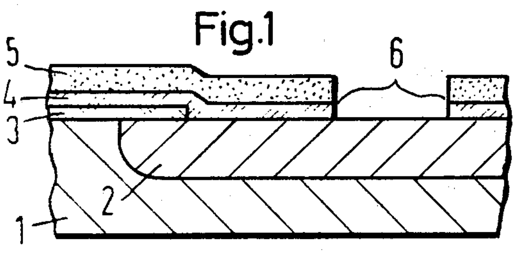

The invention relates to a method for producing a plurality of microsemiconductor components according to the planar method, more particularly, for high frequency germanium planar transistors or for circuits containing germanium planar transistors. The known planar technique method steps are employed up to formation of the emitter region.

The desire to produce planar components whose electrical characteristics, especially with regard to high frequency characteristics, permit their employment in the UHF range of necessity leads to progressively smaller emitter structures. Such structural components are usually manufactured with silicon as the original semiconductor material. It is necessary, however, for various usages to employ germanium as the fundamental material. The masking layers ($SiO_2$, $Si_3N_4$) which are a basis of the planar method are produced through thermal dissociation of a reaction gas, consisting of a silicon compound.

It is an object of the present invention to devise a method, which makes it possible to produce germanium planar transistors or integrated circuits, containing germanium planar transistors, with alloyed emitters of a minimum width, e.g. an emitter width of 2$\mu$. To produce such geometries with known methods requires, if at all feasible, difficult adjustment manipulations for applying the etching masks. Moreover, the smallest possible emitter geometry is, anyhow, determined by the controllable photo method.

The invention solves the problem of producing the smallest possible emitter geometries by manufacturing the emitter region through etching, with the aid of photo technique, an appropriate window corresponding to the area of the emitter region, into the masking layer which is produced on the semiconductor crystal surface, according to base diffusion. The emitter material is subsequently applied, in form of a metal layer, with its entire surface area upon the crystal surface that is freed from the masking layer, as well as upon the masking layer covered with the photo varnish. The photo varnish layer and also the metal layer, contained thereon, are removed thereafter with a solvent suitable for the photo varnish. Finally, the emitter material located directly on the crystal surface is alloyed into the semiconductor body.

A further development of the invention provides that the metal layer which produces the emitter material, be produced through vapor deposition in a high vacuum. It is preferable to vapor-deposit the emitter material at a layer thickness of 0.1 to 0.5$\mu$.

It is within the framework of the present invention to effect the removal of the photo varnish layer and, thus, also the removal of the metallization located upon said photo varnish layer by ultrasonics. This vapor deposition and removal of the unnecessary metal layer upon which the invention is based, by means of loosening the lower lying photo varnish layer with a special solvent, in an ultrasonic field, affords a very simple, rational and reproducible manner of producing germanium planar transistors, with emitter widths from about 2$\mu$ down.

According to a particularly preferred embodiment example of the invention, aluminum is used for the metal layer which forms the emitter material. It is very favorable for the production of the emitter region in the semiconductor body, if the alloying of the emitter material is effected in a protective gas atmosphere, e.g. in a hydrogen current, at approximately 540° C., in about 10 minutes.

Another advantage of the method of the invention is that the base connection is produced simultaneously to the emitter region, at the appropriate place of the semiconductor body. The present invention thus affords the possibility to produce even narrow vapor deposition contacts for low ohmic base contacts.

According to a particularly preferred embodiment example, alloys of gold-antimony and/or silver-antimony were found suitable as a metallizing layer for the base connection material. These are preferably applied with a layer thickness of 0.02 to 0.1$\mu$, when a gold-antimony alloy is used and with a layer thickness of 0.05 to 0.25$\mu$, when a silverantimony alloy is applied.

The metal or alloy layers, alloyed according to the method of the invention, can then be further processed by direct contacting, for example by a thermocompression method.

When vapor deposition contacting is effected, the contact metal is applied by vapor depositing aluminum, chromium-aluminum, silver-chromium or a layer sequence of chromium and aluminum or chromium and silver, with the aid of a photo mask.

The semiconductor components, produced according to the method of the invention, after having been separated from a semiconductor crystal wafer, which contains a plurality of components, and after being applied upon a conductor tape serving as a lead, are inserted into a sleeve of synthetic material, more particularly of epoxide resin or built into a metal housing.

Figure 4:
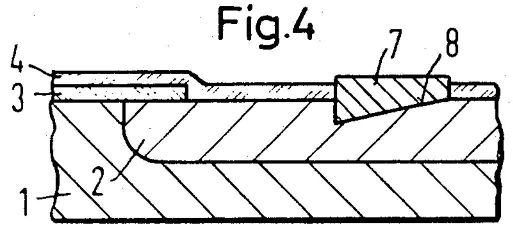
Figure 5:
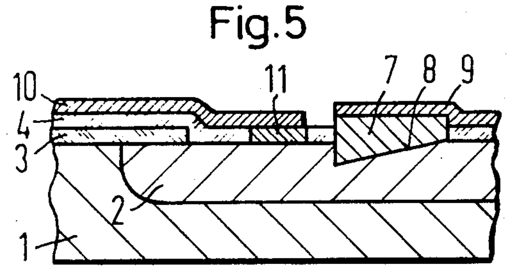
Figure 6:
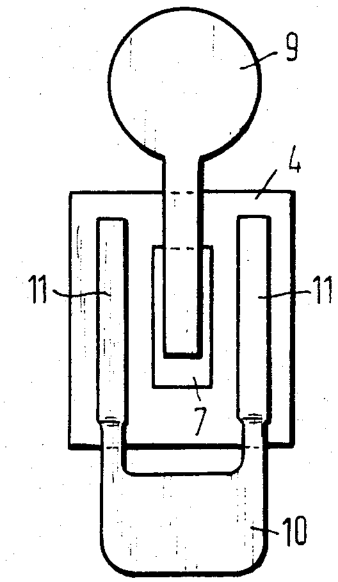
Figure 7:
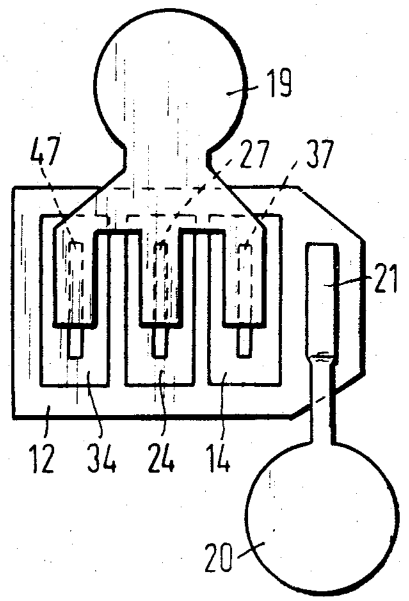

The invention will be disclosed as follows in greater details, as seen in an embodiment example, with reference to the drawing in which:

FIGS. 1 to 5 show the production process of a pnp germanium planar transistor in section; and FIGS. 6 and 7 are shown in a plane view, after completion.

FIG. 1 shows a p-doped (for example a 3 ohm-cm.) germanium wafer 1 whose surface is inclined toward the 111-plane, by approximately 1 to 2°, wherein a base region is produced, with known production steps by using the planar technique, by diffusing an n-doped material (antimony), down to a depth of 2$\mu$. A masking layer 3, provided for base diffusion and comprised of pyrolytically precipitated $SiO_2$ is on the surfale of the semiconductor crystal body. This masking layer is, if necessary, coated with phosphorus. A second masking layer 4, comprised of pyrolytically precipitated $SiO_2$ is on the phosphorus layer. A window 6 is etched into the layers, with the aid of known photo lithography methods by using a photo varnish layer 5 of about 1 to 1.5$\mu$, which serves as an etching mask to install an emitter region.

Figure 2:
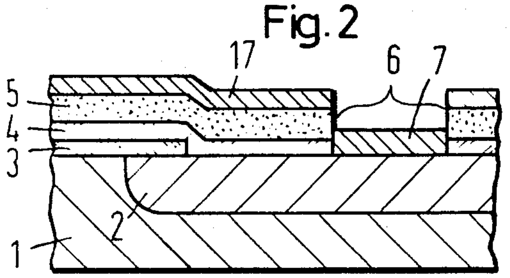

Then, as shown in FIG. 2, without removing the etching mask 5, comprised of photo varnish, the exposed crystal surface in the region of window 6 as well as the adjacent regions of the masking layer 4, have vapor deposited over the entire area a thin aluminum layer 7 and 17, under high vacuum and at a layer thickness of about 0.4$\mu$ which constitutes the emitter material. The same reference numerals apply, as in FIG. 1.

Figure 3:
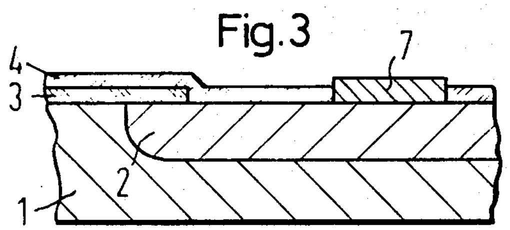

The device shown in FIG. 3 results when the etching mask 5 is removed by processing of the entire device, of FIG. 2, in an ultrasonic field with a solvent for photo varnish, for example acetone. The ultrasonic oscillations loosen the photo varnish layer 5 immediately, and the aluminum layer 17 located thereon. The aluminum layer 7 which is located directly on the crystal surface or base region 2 adheres tightly and is alloyed in a hydrogen atmosphere, at 540° C., for a period of about 10 minutes, as illustrated in FIG. 4. This produces the emitter-base p-n junction 8. The step effect in 7 is caused by the crystal orientation. The same reference numerals apply as in FIGS. 1 to 3.

FIG. 5 shows the same arrangement after the emitter contact material 9, and the base contact material 10 are applied. Prior to this, by using the same method according to the present invention, the base contact material 11 is applied and alloyed, which is comprised e.g. of a 0.05$\mu$ thick gold-antimony layer and, possibly, contains above it a 0.2$\mu$ thick AgSb layer which is intended to produce a sufficiently low ohmic contact.

The sequence in which the emitter is applied and the base connection material is applied, may be interchanged. The alloying-in of both materials can be effected simultaneously. To produce the emitter or the base vapor deposition contacts 9 and 10, it is preferred to vapor deposit chromium and silver, with the aid of a photo mask. The contact materials can be of the same material and simultaneously applied.

FIG. 6 shows in plane view a germanium planar transistor, produced according to the method of the present invention, whose emitter surface amounts to $10\times25\mu^2$. The same numerals apply as in the other figures.

FIG. 7 shows a semiconductor device comprised of three emitters (27, 37 and 47). Each emitter surface has an area of $2.5\times20\mu^2$. The three emitters are connected by an emitter contact 19. The base connection is indicated as 21 and the base contact as 20. The actual base region is indicated as 14, 24 and 34.

To obtain a low ohmic base connection, this embodiment shows that, according to a known method, prior to the actual base diffusion 14, 24, 34, a base transit path 12 was diffused e.g. with arsenic.

The method is not only suitable for the production of germanium planar components, but also for producing components comprised of silicon or of compound semiconductors.

I claim:

1. In the method of producing a plurality of microsemiconductor components, particularly high frequency germanium planar transistor elements, wherein conventional planar steps are used up to the production of the emitter region in a germanium body, the improvement which comprises producing a masking photo varnish layer over the surface, etching a window into the masking layer, corresponding to the area of the emitter region, applying the emitter material with its entire area, in form of a metal layer, upon the crystal surface, freed from the masking layer, and upon the adjacent masking, lifting off the photo varnish layer and the metal layer located thereon with a solvent for the photo varnish and, finally, alloying the emitter material located directly on the crystal surface into the semiconductor body.

2. The method of claim 1, wherein the metal layer which forms the emitter material is produced through vapor deposition in a high vacuum.

3. The method of claim 1, wherein the emitter material is applied at a layer thickness of 0.1 to 0.5$\mu$.

4. The method of claim 1, wherein the removal of the photovarnish layer is effected in an ultrasonic bath.

5. The method of claim 1, wherein aluminum is used for the metal layer which forms the emitter material.

6. The method of claim 1, wherein the emitter material is alloyed in a protective gas atmosphere, at approximately 540° C., for about 10 minutes.

7. The method of claim 6, wherein hydrogen is the protective gas.

8. The method of claim 1, wherein, at the same time the emitter region is produced, a base connection is produced and applied in the same manner, at the appropriate place of the semiconductor body simultaneously to the production of the emitter region.

9. The method of claim 8, wherein the base connection material is an alloy selected from the group consisting of gold-antimony, silver-antimony and mixtures thereof.

10. The method of claim 9, wherein, when gold-antimony is used, the base connecting material is applied at a layer thickness of 0.02 to 0.1$\mu$ and when silver antimony is used, a layer thickness of 0.05 to 0.25$\mu$ is applied.

11. The method of claim 10, wherein a contact is applied directly upon the alloyed metal layers.

12. The method of claim 1, wherein silicon or compound semiconductor material is used for the semiconductor body.

References Cited

UNITED STATES PATENTS 3,341,377 9/1967 Wacker ............ 148—179

RICHARD O. DEAN, Primary Examiner

U.S. Cl. X.R.

148—33.3, 180, 185